United States Patent [19]

Yoshida

[11] Patent Number: 5,091,671
[45] Date of Patent: Feb. 25, 1992

[54] PIEZOELECTRIC OSCILLATOR

[75] Inventor: Ryuhei Yoshida, Nagaokakyo, Japan

[73] Assignee: Murata Manufacturing Co., Ltd., Japan

[21] Appl. No.: 585,481

[22] Filed: Sep. 20, 1990

[30] Foreign Application Priority Data

Sep. 20, 1989 [JP] Japan .................. 1-244133

[51] Int. Cl.$^5$ .............................. H01L 41/08
[52] U.S. Cl. ..................... 310/358; 310/320; 310/366
[58] Field of Search .............. 310/320, 366, 358, 348

[56] References Cited

U.S. PATENT DOCUMENTS

| | | | |
|---|---|---|---|
| 3,593,219 | 7/1971 | Tsuchiya | 310/320 X |
| 3,745,385 | 7/1973 | Nakajima et al. | 310/358 |
| 3,763,446 | 10/1973 | Toyoshima et al. | 310/320 X |
| 4,384,229 | 5/1983 | Inoue et al. | 310/358 X |
| 4,503,352 | 3/1985 | Inoue | 310/320 X |
| 4,564,825 | 1/1986 | Takahashi et al. | 310/366 X |
| 4,703,218 | 10/1987 | Takahashi et al. | 310/320 X |

FOREIGN PATENT DOCUMENTS 0069595 6/1978 Japan ........................... 310/321

Primary Examiner—Mark O. Budd
Attorney, Agent, or Firm—Ostrolenk, Faber, Gerb & Soffen

[57] ABSTRACT

A piezoelectric oscillator containing load capacitances utilizing the thickness shear vibration mode of a piezoelectric plate. In this piezoelectric oscillator, a pair of divided electrodes are formed on one major surface of a piezoelectric plate and are divided by a gap provided in a direction extending from one end surface to the other end surface of the piezoelectric plate, and the pair of divided electrodes are formed so as to be opposed to a common electrode formed on the other major surface of the piezoelectric plate through the piezoelectric plate.

7 Claims, 6 Drawing Sheets

PIEZOELECTRIC OSCILLATOR

BACKGROUND OF THE INVENTION

1. Field of the Invention

The present invention relates generally to a piezoelectric oscillator using an energy-trapped type piezoelectric resonator, and more particularly, to a piezoelectric oscillator in which capacitances are formed.

2. Description of the Prior Art

FIG. 1 is a perspective view showing one example of a conventional piezoelectric oscillator containing load capacitances which is used in a Colpitts oscillation circuit or the like. In a piezoelectric oscillator 1, an energy-trapped type piezoelectric resonator 4 is contained between terminals 2 and 3 having U-shaped cup portions 2a and 3a. The piezoelectric resonator 4 has a structure in which resonance electrodes 5a and 5b are formed on both major surfaces of a piezoelectric plate 4a so as to be opposed to each other in the central region of the piezoelectric plate 4a. The resonance electrodes 5a and 5b are respectively joined to the U-shaped cup portions 2a and 3a of the terminals 2 and 3 by solder joints 6a and 6b. Further, a capacitor 7 is joined to the outer parts of the U-shaped cup portions 2a and 3a.

The capacitor 7 has a structure in which capacitance electrodes are formed on both major surfaces of a dielectric plate 8a. In FIG. 1, only a capacitance electrode 8b on one of the major surfaces is shown. However, a pair of capacitance electrodes are formed and are spaced apart from each other by a predetermined distance on the other major surface. The paired capacitance electrodes are respectively opposed to the capacitance electrode 8b. A terminal 9 is joined to the center of the capacitance electrode 8b.

It has also been known to join a capacitor 7 not to the outer parts of the U-shaped cup portions 2a and 3a but to positions at the height of the central parts of lead-out portions 2b and 3b of the terminals 2 and 3.

In the above described piezoelectric oscillator 1, the terminals 2 and 3 have a complicated shape and the capacitor 7 is joined to the outer parts thereof so as to provide load capacitances. More specifically, in order to provide the capacitances, the additional separately formed capacitor 7 is required, resulting in a relatively large number of components.

Furthermore, the terminals 2 and 3 of complicated shape must be prepared. Moreover, in joining the piezoelectric resonator 4 to the terminals 2 and 3 or joining the capacitor 7 to the outer parts thereof, complicated work is forced to be performed. Consequently, the piezoelectric oscillator 1 becomes substantially higher in cost. It is needed to reduce the cost.

SUMMARY OF THE INVENTION

Accordingly, an object of the present invention is to provide a piezoelectric oscillator containing capacitances which is constituted by a relatively small number of components, is easily assembled and is low in cost.

The piezoelectric oscillator according to the present invention is a piezoelectric oscillator utilizing the energy-trapped type thickness shear vibration mode, which is constructed using a piezoelectric plate subjected to polarization processing in a direction parallel to its major surfaces. A pair of divided electrodes are formed on one of the major surfaces of the piezoelectric plate so that each extends from one end surface of the piezoelectric plate to the central region thereof and the pain of divided electrodes are separated by a gap extending from the above-mentioned one end surface to the other end surface. A common electrode is formed on the other major surface of the piezoelectric plate so as to extend from the above-mentioned other end surface of the piezoelectric plate to the central region thereof. This common electrode is arranged so as to be opposed to the above pair of divided electrodes through the piezoelectric plate in the central region of the piezoelectric plate.

In the piezoelectric oscillator according to the present invention, the pair of divided electrodes are used as an input electrode and an output electrode and the common electrode is connected to a ground electrode, thereby forming load capacitances between the input electrode and the ground potential and between the output electrode and the ground potential due to the above described electrode structure. More specifically, the piezoelectric oscillator constructed as described makes it possible to omit an additional separate capacitor. Consequently, the number of components can be reduced, and the assembly process is simplified. Accordingly, it becomes possible to obtain a piezoelectric oscillator containing load capacitances which is low in cost and small in size.

The foregoing and other objects, features, aspects and advantages of the present invention will become more apparent from the following detailed description of embodiments of the present invention when taken in conjunction with the accompanying drawings.

DESCRIPTION OF THE PREFERRED EMBODIMENTS

Figure 2:
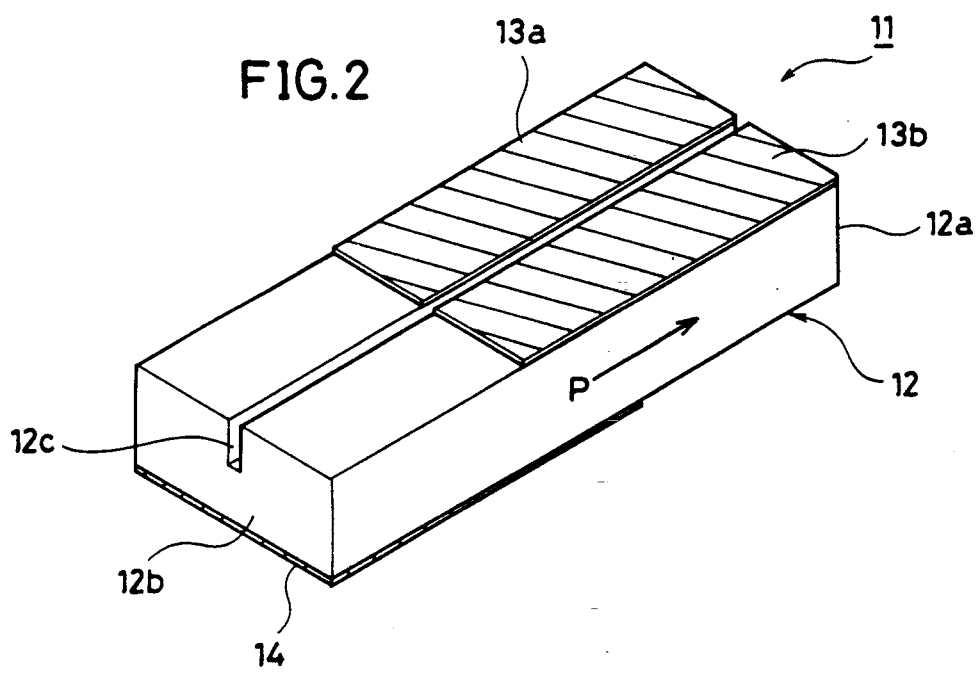
FIG. 2 is a perspective view showing a piezoelectric oscillator according to one embodiment of the present invention.

FIG. 2 is a perspective view showing one embodiment of a piezoelectric oscillator according to the present invention. In a piezoelectric oscillator 11, a piezoelectric plate 12 made of a piezoelectric material such as piezoelectric ceramics is subjected to polarization processing in parallel with major surfaces of the piezoelectric plate 12, as represented by an arrow P.

A pair of divided electrodes 13a and 13b and a common electrode 14 are respectively formed on the uppper surface and the lower surface of the piezoelectric plate 12. The divided electrodes 13a and 13b are formed on the upper surface of the piezoelectric plate 12 so as to extend from one end surface 12a of the piezoelectric plate 12 to the central region thereof. On the other hand, the common electrode 14 is formed so as to extend from the other end surface 12b of the piezoelectric plate 12 to the central region thereof. In the central region, the divided electrodes 13a and 13b and the common electrode 14 are arranged so as to be opposed to each other through the piezoelectric plate 12.

The divided electrodes 13a and 13b are separated by a groove 12c extending from the one end surface 12a to the other end surface 12b of the piezoelectric plate 12. However, the groove 12c is not an element indispensable to the present invention. More specifically, not a groove having a depth but a gap by which the divided electrodes 13a and 13b are separated may be formed.

Figure 3A:
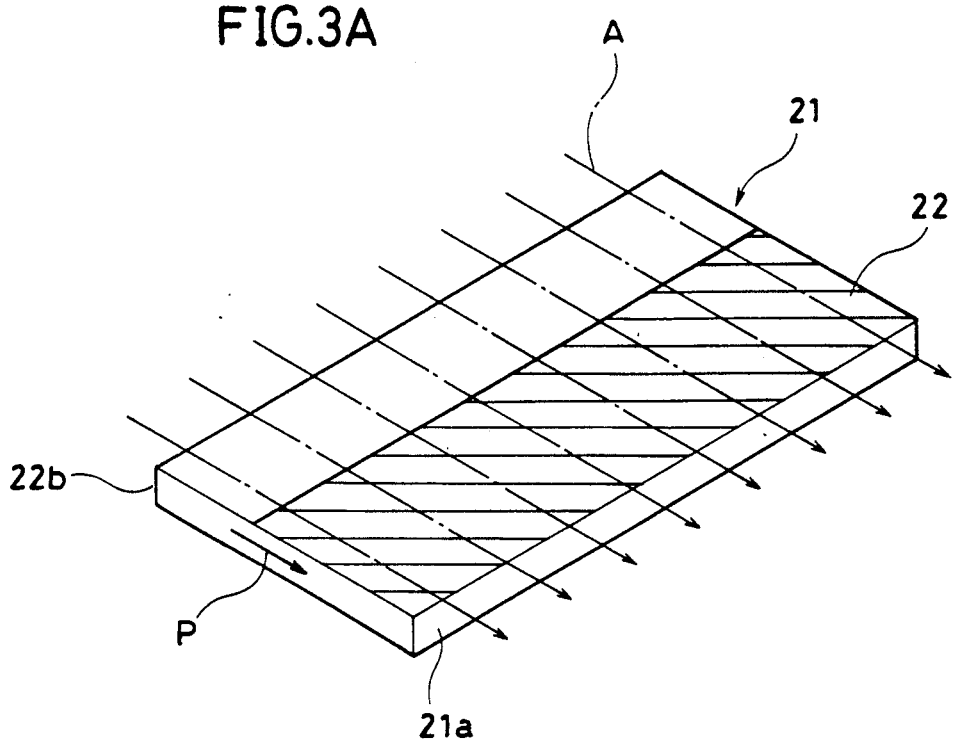
FIGS. 3A and 3B are perspective views for respectively explaining the manufacturing processes of the piezoelectric oscillator according to the disclosed embodiment of the present invention.
Figure 3B:
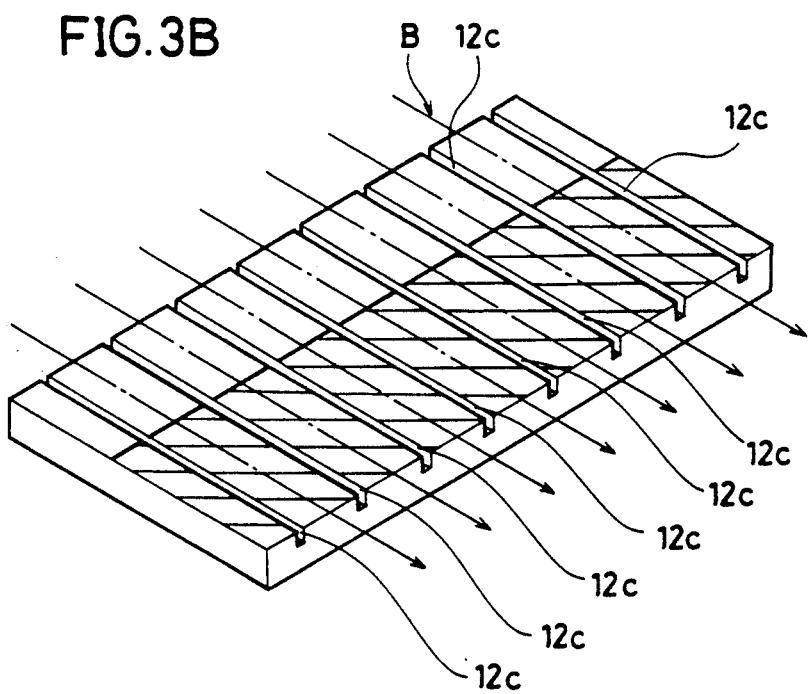

The above described piezoelectric oscillator 11 is fabricated using a mother piezoelectric plate 21 subjected to polarization processing in a direction represented by an arrow P, as shown in FIG. 3A. More specifically, an electrode 22 extending from one end surface 21a of the piezoelectric plate 21 to the central region thereof and an electrode (not shown) extending from an end surface 22b of the piezoelectric plate 21 to the central region thereof are respectively formed on the upper surface and the lower surface of the piezoelectric plate 21. Then, the piezoelectric plate 21 is scribed and cut along dot and dash lines A, thereby to form a plurality of grooves 12c as shown in FIG. 3B. Therefore, the piezoelectric plate 12 is cut along dot and dash lines B shown in FIG. 3B, thereby to make it possible to simply mass-produce the piezoelectric oscillator 11 shown in FIG. 2.

Figure 1:
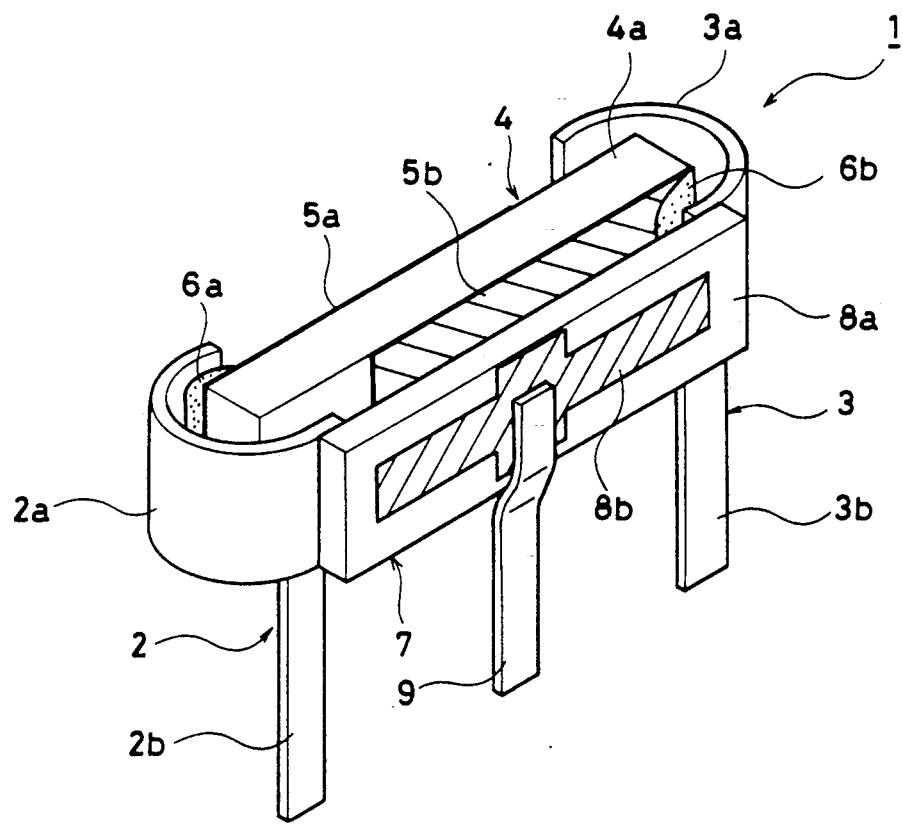
FIG. 1 is a perspective view showing a conventional piezoelectric oscillator.
Figure 4:
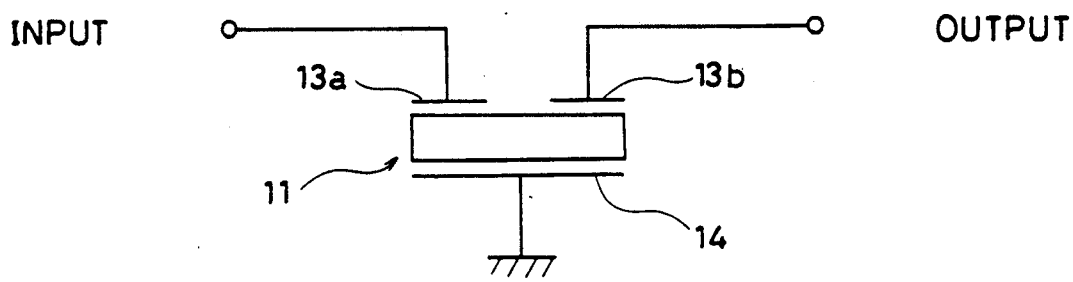
FIG. 4 is a diagram symbolically showing the piezoelectric oscillator according to the disclosed embodiment.
Figure 5:
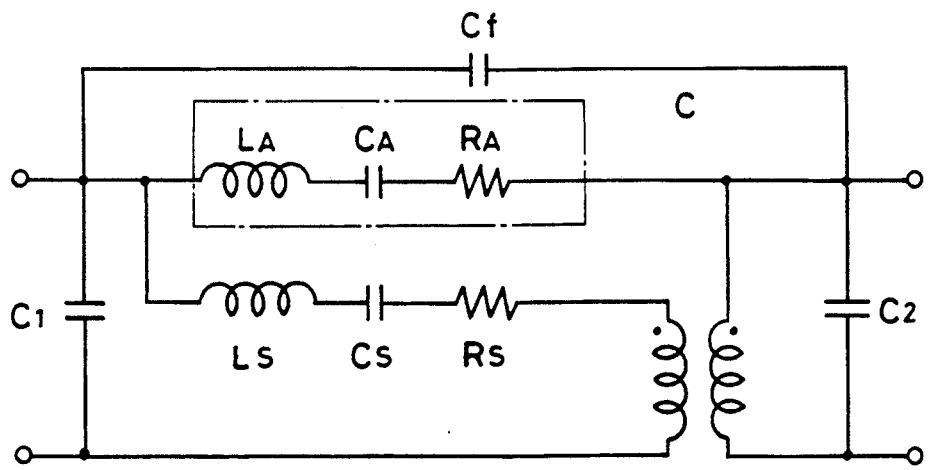
FIG. 5 is a diagram showing an electrically equivalent circuit of the piezoelectric oscillator according to the disclosed embodiment.

Description is now made of the function and the effect of the piezoelectric oscillator 11 with reference to FIGS. 4 and 5. FIG. 4 is a circuit diagram symbolically showing the piezoelectric oscillator 11. If divided electrodes 13a and 13b in this piezoelectric oscillator 11 are respectively used as an input electrode and an output electrode and a common electrode 14 is connected to a ground potential, its electrically equivalent circuit is as shown in FIG. 5. In FIG. 5, the oscillation in the S mode which is enclosed by a dot and dash line C becomes intense. In the piezoelectric oscillator 11 according to the present embodiment, therefore, load capacitances can be provided between the input electrode and the ground potential and between the output electrode and the ground potential by using the piezoelectric oscillator 11 as shown in FIG. 4. Accordingly, load capacitances can be provided by the piezoelectric oscillator 11 without using a capacitor separately formed such as the capacitor 7 in the conventional example shown in FIG. 1, thereby to make it possible to effectively reduce the number of components.

Figure 6:
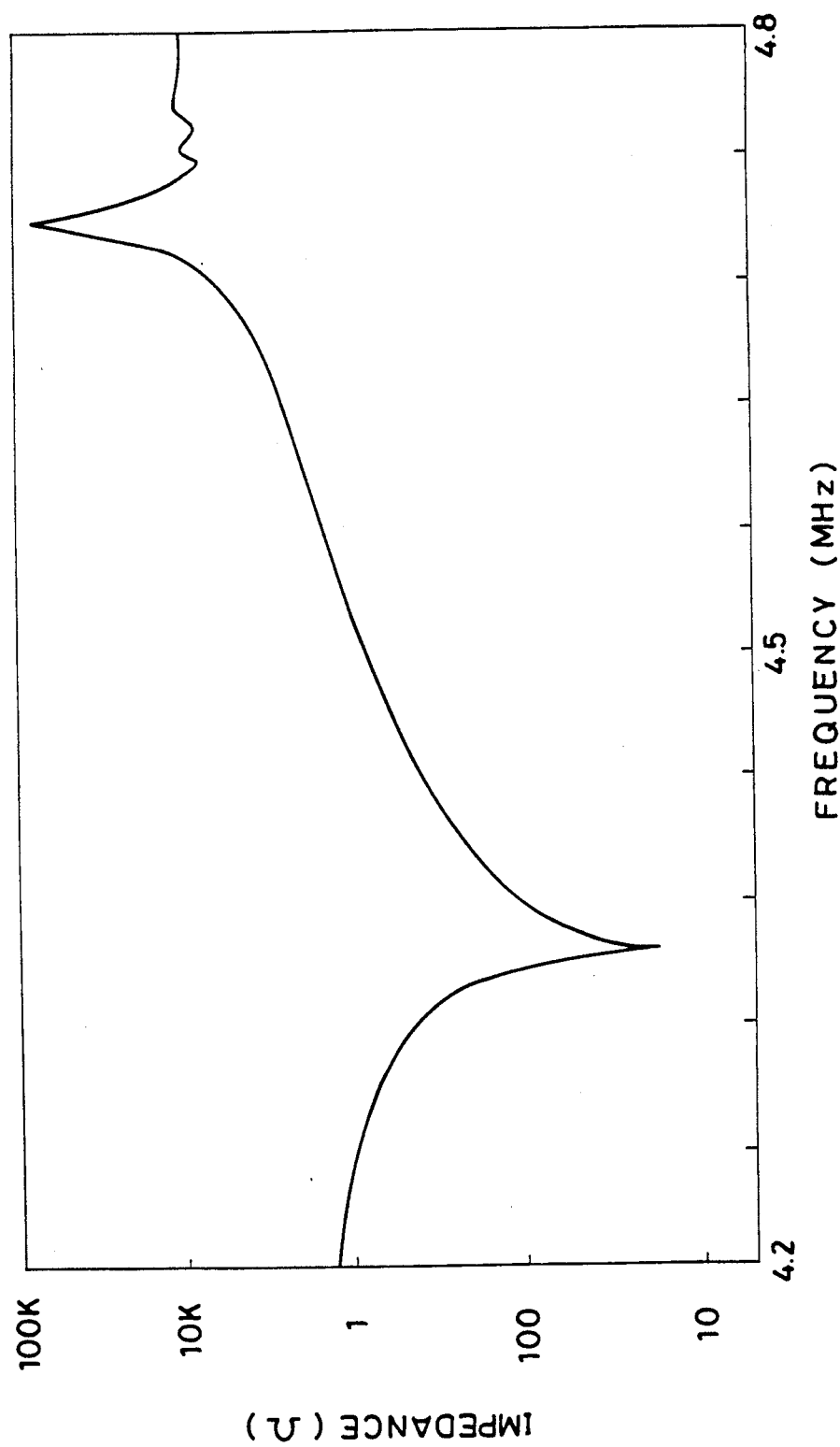
FIG. 6 is a diagram showing impedance-frequency characteristics of the piezoelectric oscillator according to the disclosed embodiment.

FIG. 6 shows impedance-frequency characteristics of the above described piezoelectric oscillator 11.

Figure 7:
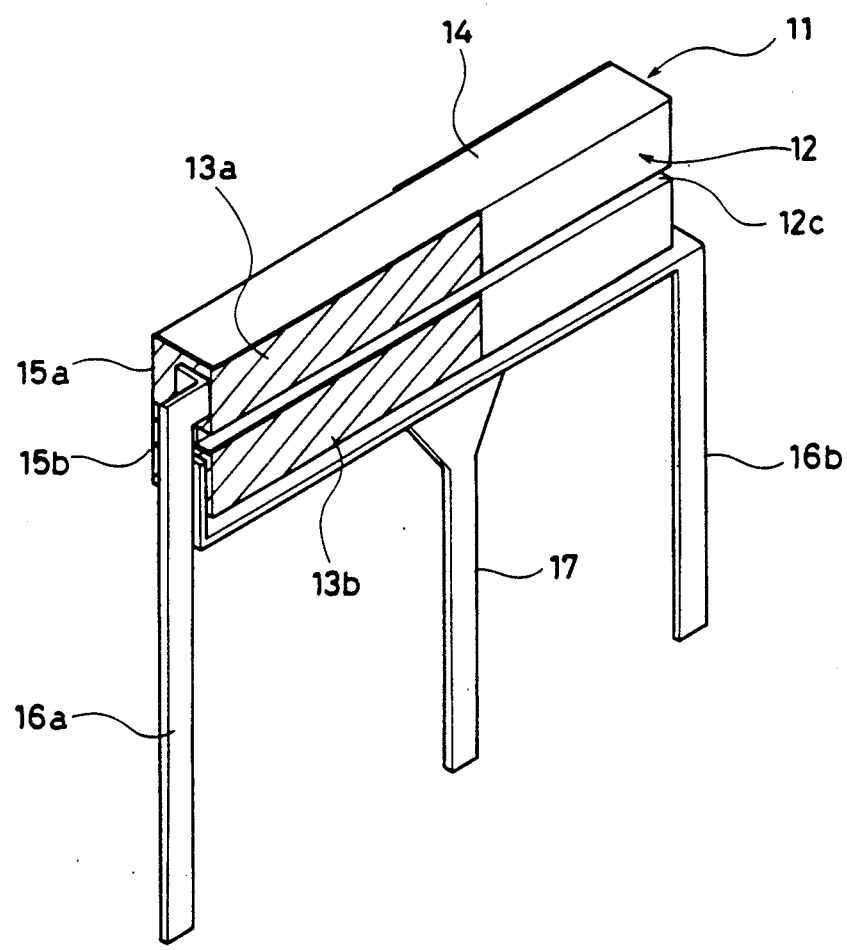
FIG. 7 is a perspective view showing an example in which the piezoelectric oscillator according to the disclosed embodiment is constructed as a component with lead terminals.
Figure 8:
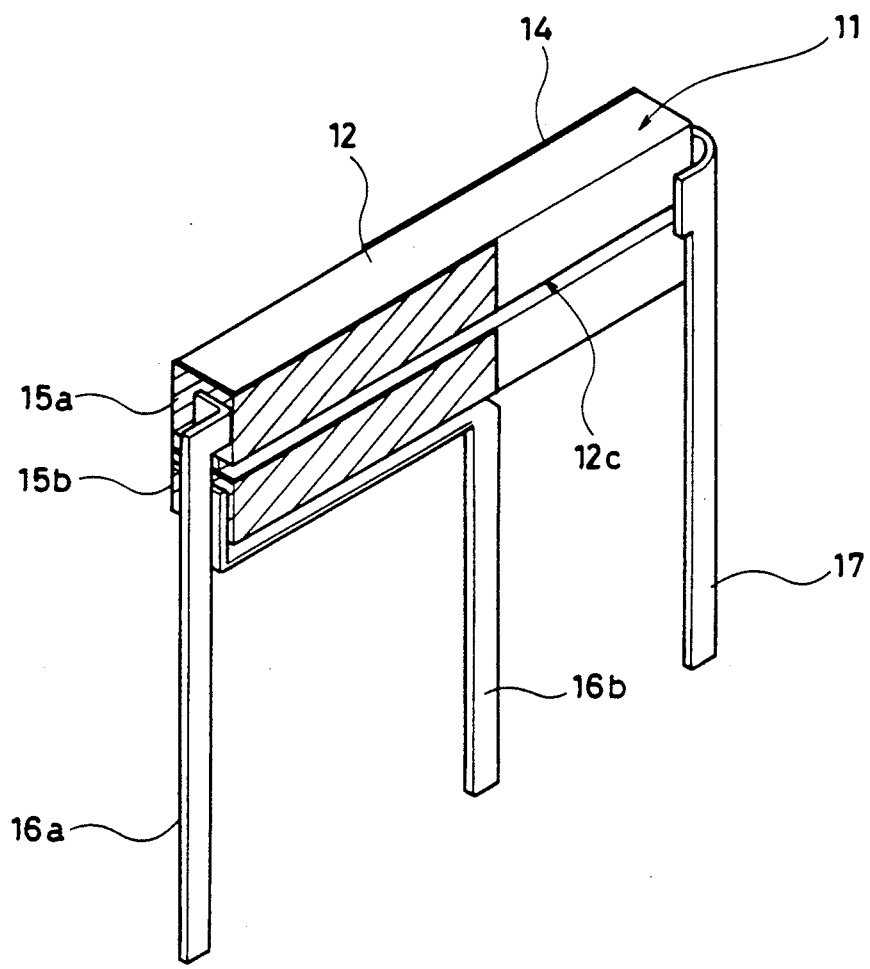
FIG. 8 is a perspective view showing another example in which the piezoelectric oscillator according to the disclosed embodiment is constructed as a component with lead terminals.

FIGS. 7 and 8 are perspective views respectively showing examples in which the above piezoelectric oscillator 11 is constructed as a component with lead terminals. In the construction shown in FIG. 7, conductive films 15a and 15b are formed on one end surface of the piezoelectric plate 12 so as to be electrically connected to the divided electrodes 13a and 13b, respectively. More specifically, the conductive films 15a and 15b maybe formed after obtaining the piezoelectric oscillator 11 shown in FIG. 2. The conductive films 15a and 15b may also be formed simultaneously with the divided electrodes 13a and 13b.

Lead terminals 16a and 16b are respectively joined to the conductive films 15a and 15b by solder joints (not shown). On the other hand, a lead terminal 17 is joined to the common electrode 14. The lead terminal 17 may be joined to a conductive film (not shown) formed on the other end surface of the piezoelectric plate and electrically connected to the common electrode 14.

Furthermore, in the construction shown in FIG. 7, the lead terminals 16a and 16b electrically connected to the divided electrodes 13a and 13b serving as input and output electrodes are extended downward from the two end surfaces of the piezoelectric plate 12. However, as shown in FIG. 8, one lead terminal 16b of lead terminals 16a and 16b connected to the divided electrodes 13a and 13b serving as input and output electrodes may be extended downward from the vicinity of the center of the piezoelectric plate 12. In this case, the lead terminal 17 joined to the common electrode 14 is extended downward from the other end surface of the piezoelectric plate 12.

As can be seen from FIGS. 7 and 8, no separately formed capacitor is required in the piezoelectric oscillator 11 according to the disclosed embodiment. Accordingly, it is only necessary to prepare the lead terminals 16a, 16b and 17 each having a very simple structure. Further, an oscillator with lead terminals can be simply constructed by merely joining the lead terminals 16a, 16b and 17 to the respective electrodes.

Figure 9:
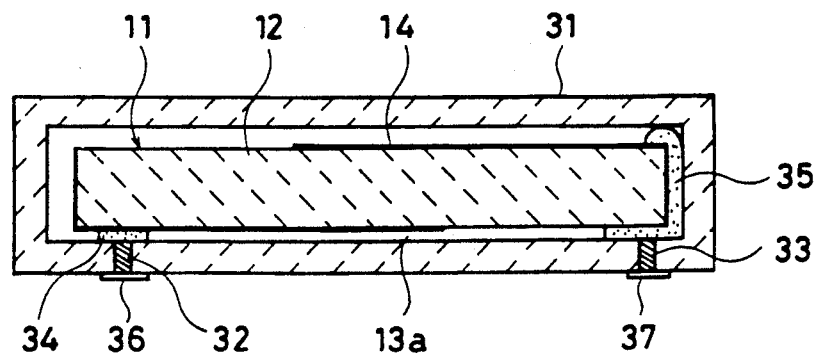
FIG. 9 is a cross-sectional view showing an example in which the piezoelectric oscillator according to the disclosed embodiment is constructed as a chip-type component.

FIG. 9 is a cross sectional view showing an example in which a piezoelectric oscillator is constructed as a chip-type component. In FIG. 9, a piezoelectric oscillator 11 is contained in a case 31 made of an insulating material such as alumina. Through holes 32 and 33 are formed in the case 31. The through holes 32 and 33 are electrically connected to a divided electrode 13a and a common electrode 14 by conductive pastes 34 and 35, respectively.

On the lower surface of the case 31, the through holes 32 and 33 are electrically connected to terminal electrodes 36 and 37, respectively. The other divided electrode 13b is also electrically connected to a through hole by a conductive paste similarly to the divided electrode 13a and is electrically connected to a terminal electrode formed on the lower surface of the case 31, which is not obvious from FIG. 9. The case 31 may be obtained by affixing an alumina substrate of suitable shape and a frame to each other.

As can be seen from FIG. 9, the piezoelectric oscillator 11 in the above describe embodiment can be constructed as a chip component very easily by using a suitable case material. Also in this case, no additional capacitor is required, thereby to make it possible to achieve an oscillator containing load capacitances which is very small in size.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A piezoelectric oscillator utilizing the thickness shear vibration mode of a piezoelectric plate, comprising:
   a piezoelectric plate subjected to polarization processing in substantially one direction parallel to its major surfaces;
   a pair of divided electrodes formed on one of the major surfaces of said piezoelectric plate so as to extend from one end surface of the piezoelectric plate to the central region thereof, said electrodes being separated by a groove formed in one and only one of the major surfaces of said piezoelectric plate, and not extending to the other major surface, and said groove extending over the full length of said piezoelectric plate from said one end surface to the other end surface; and
   a common electrode formed on the other major surface of said piezoelectric plate so as to extend from said other end surface of the piezoelectric plate to the central region thereof and so as to be opposed to said pair of divided electrodes through the piezoelectric plate in the central region of the piezoelectric plate.

2. The piezoelectric oscillator according to claim 1, wherein said groove is formed substantially halfway across the piezoelectric plate in the width direction thereof while extending in the length direction of the piezoelectric plate.

3. The piezoelectric oscillator according to claim 1, wherein a pair of conductive films electrically connected to said pair of divided electrodes is formed on one end surface of said piezoelectric plate.

4. The piezoelectric oscillator according to claim 3, which further comprises input and output lead terminals joined to said pair of conductive films, and an earth terminal joined to said common electrode.

5. The piezoelectric oscillator according to claim 3, which further comprises a conductive film electrically connected to said common electrode, and an earth terminal joined to said common electrode.

6. The piezoelectric oscillator according to claim 3, which further comprises a case containing said piezoelectric oscillator, an electrode for connection to the exterior being formed on the outer surface of said case so that the piezoelectric oscillator is constructed as a tip component.

7. The piezoelectric oscillator according to claim 3, wherein said piezoelectric plate is rectangular.

* * * * *